(12) United States Patent
Fukuda et al.

(10) Patent No.: US 9,545,026 B2
(45) Date of Patent: Jan. 10, 2017

(54) ELECTRONIC COMPONENT MODULE AND AN ASSEMBLY INCLUDING THE SAME

(71) Applicant: PANASONIC CORPORATION, Osaka (JP)

(72) Inventors: Toshiyuki Fukuda, Kyoto (JP); Keisuke Kodera, Hyogo (JP); Fumito Itou, Osaka (JP); Toshihiro Miyoshi, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 104 days.

(21) Appl. No.: 14/612,271

(22) Filed: Feb. 2, 2015

(65) Prior Publication Data

US 2015/0181739 A1   Jun. 25, 2015

Related U.S. Application Data

(63) Continuation of application No. PCT/JP2013/001402, filed on Mar. 6, 2013.

(30) Foreign Application Priority Data

Aug. 3, 2012  (JP) .................................. 2012-172685

(51) Int. Cl.
*H05K 7/02* (2006.01)
*H01L 23/00* (2006.01)
(Continued)

(52) U.S. Cl.
CPC ................. *H05K 7/02* (2013.01); *H01L 23/13* (2013.01); *H01L 23/345* (2013.01);
(Continued)

(58) Field of Classification Search
CPC .... H01L 23/13; H01L 23/345; H01L 23/3677; H01L 23/5386; H01L 23/5389; H01L 23/66; H01L 24/97; H01L 25/16; H01L 2223/6677; H01L 2224/16225; H01L 2224/32225; H01L 2224/73253; H01L 2224/83192; H01L 2224/97; H01L 2924/12042; H01L 2924/15153; H01L 2924/15159; H01L 2924/15162; H01L 2924/15321; H01L 2924/19105; H05K 7/02
(Continued)

(56) References Cited

U.S. PATENT DOCUMENTS 6,301,114 B1 * 10/2001 Ootani ................ H01L 23/3677
257/713
2001/0013654 A1 * 8/2001 Kalidas ............. H01L 23/49816
257/738
(Continued)

FOREIGN PATENT DOCUMENTS

JP   2000-200860 A   7/2000
JP   2003-007910 A   1/2003
(Continued)

OTHER PUBLICATIONS

International Search Report issued in International Application No. PCT/JP2013/001402 with Date of mailing Apr. 2, 2013, with English Translation.

*Primary Examiner* — Anthony Haughton
*Assistant Examiner* — Yahya Ahmad
(74) *Attorney, Agent, or Firm* — McDermott Will & Emery LLP

(57) ABSTRACT

An electronic component module includes a board, a plurality of external terminals provided on a first surface of the board, and a first semiconductor chip provided on a region on the first surface surrounded by the plurality of external terminals. The first semiconductor chip protrudes more
(Continued)

along a normal to the first surface than ends of the external terminals do.

20 Claims, 12 Drawing Sheets

(51) Int. Cl.
| | | |
|---|---|---|
| H01L 25/16 | (2006.01) | |
| H01L 23/13 | (2006.01) | |
| H01L 23/34 | (2006.01) | |
| H01L 23/367 | (2006.01) | |
| H01L 23/538 | (2006.01) | |
| H01L 23/66 | (2006.01) | |

(52) U.S. Cl.
CPC ...... *H01L 23/3677* (2013.01); *H01L 23/5386* (2013.01); *H01L 23/5389* (2013.01); *H01L 23/66* (2013.01); *H01L 24/97* (2013.01); *H01L 25/16* (2013.01); *H01L 2223/6677* (2013.01); *H01L 2224/16225* (2013.01); *H01L 2224/32225* (2013.01); *H01L 2224/73253* (2013.01); *H01L 2224/83192* (2013.01); *H01L 2224/97* (2013.01); *H01L 2924/12042* (2013.01); *H01L 2924/15153* (2013.01); *H01L 2924/15159* (2013.01); *H01L 2924/15162* (2013.01); *H01L 2924/15321* (2013.01); *H01L 2924/19105* (2013.01)

(58) Field of Classification Search
USPC .............. 361/728, 760, 767, 777, 778, 783; 174/250–268; 257/678–733
See application file for complete search history.

(56) References Cited

U.S. PATENT DOCUMENTS

| | | | | |
|---|---|---|---|---|
| 2003/0071350 A1* | 4/2003 | Takehara | ............ | H01L 23/3121 257/728 |
| 2003/0128522 A1* | 7/2003 | Takeda | .................. | H01L 23/345 361/715 |
| 2006/0043581 A1* | 3/2006 | Prokofiev | .............. | H05K 1/141 257/713 |
| 2006/0170113 A1* | 8/2006 | Tanaka | ..................... | H01L 23/13 257/778 |
| 2009/0067135 A1* | 3/2009 | Hirai | .................. | H01L 23/3107 361/715 |
| 2010/0038122 A1* | 2/2010 | Sakinada | ................ | H01L 23/10 174/260 |
| 2012/0038445 A1* | 2/2012 | Finn | .................. | G06K 19/07794 336/105 |
| 2014/0104133 A1* | 4/2014 | Finn | .................. | G06K 19/07769 343/866 |
| 2015/0160701 A1* | 6/2015 | Bruno | ..................... | H01L 25/16 361/679.31 |
| 2015/0179621 A1* | 6/2015 | Matsumoto | ............. | H01L 25/16 257/737 |
| 2015/0269472 A1* | 9/2015 | Finn | ....................... | B23K 26/40 235/492 |

FOREIGN PATENT DOCUMENTS

| | | | |
|---|---|---|---|
| JP | 2003-124435 A | | 4/2003 |
| JP | 2003-203943 A | | 7/2003 |
| JP | 2003-204013 A | | 7/2003 |
| JP | 2003203943 A | * | 7/2003 |
| JP | 2005-117139 A | | 4/2005 |
| JP | 2006-210777 A | | 8/2006 |
| JP | 2009-105327 A | | 5/2009 |
| JP | 2010-045201 A | | 2/2010 |
| JP | 2010-239344 A | | 10/2010 |

* cited by examiner

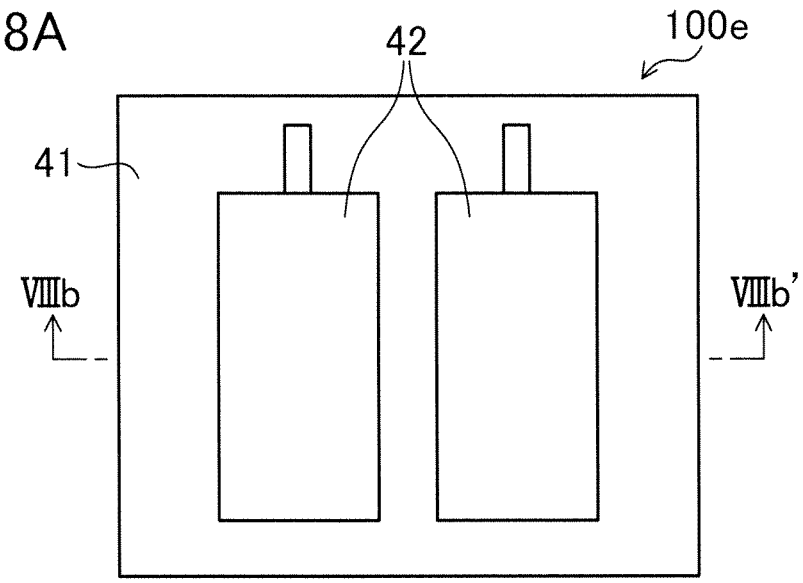
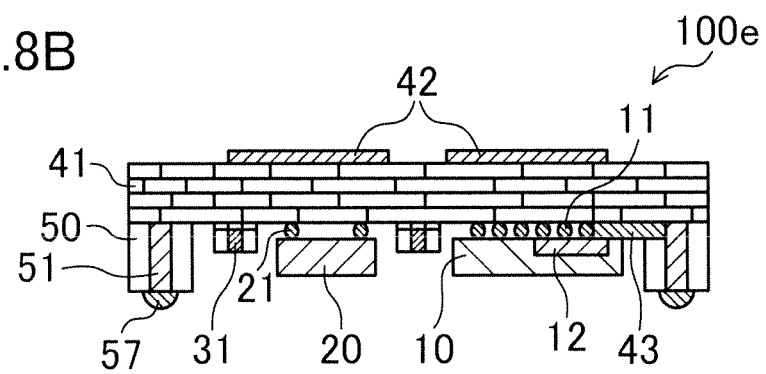
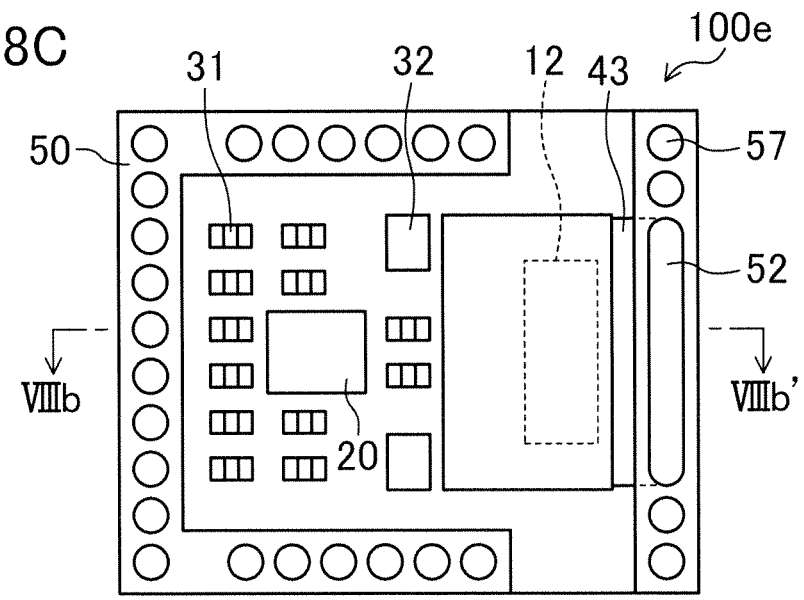

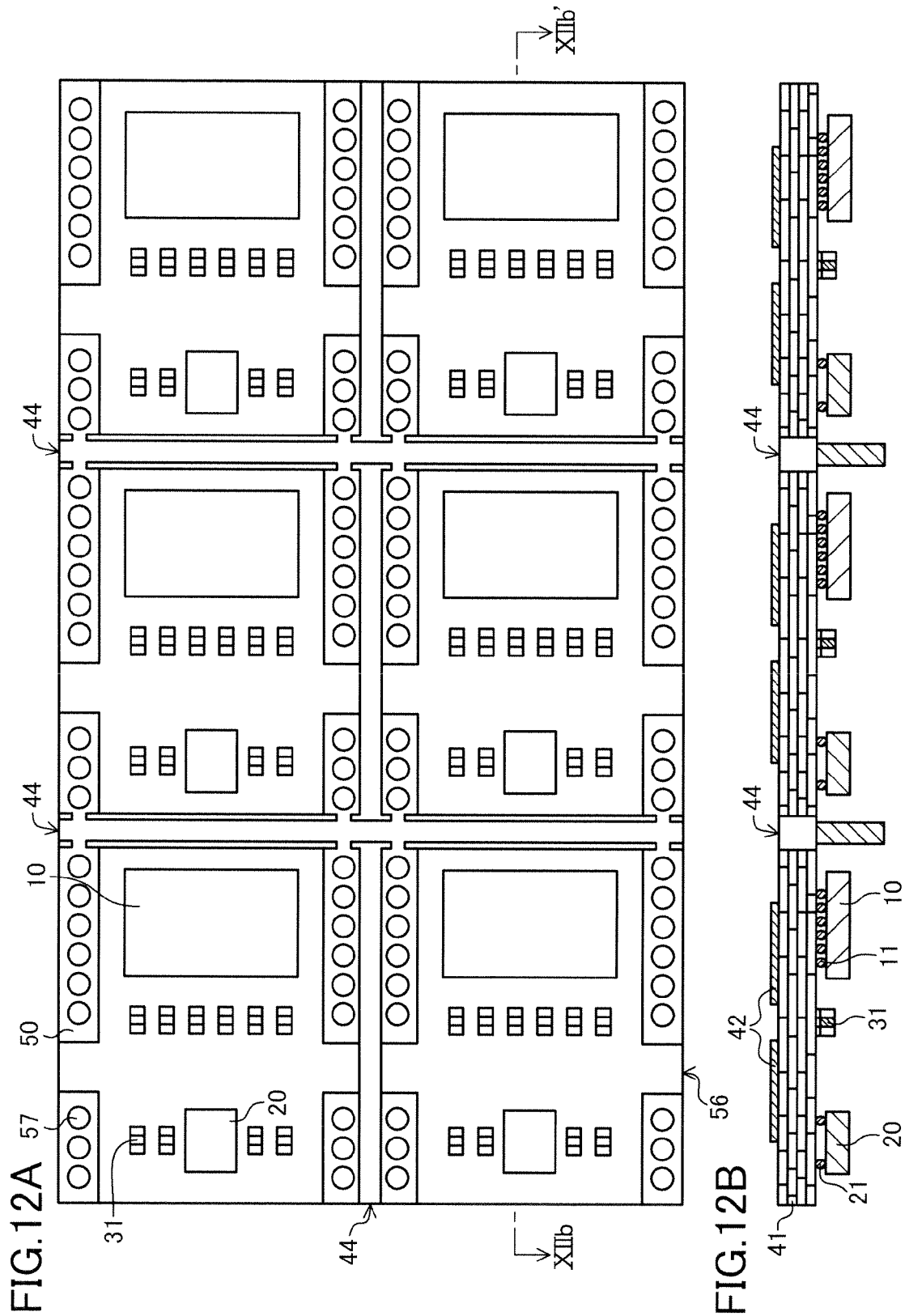

ELECTRONIC COMPONENT MODULE AND AN ASSEMBLY INCLUDING THE SAME

CROSS-REFERENCE TO RELATED APPLICATIONS

This is a continuation of International Application No. PCT/JP2013/001402 filed on Mar. 6, 2013, which claims priority to Japanese Patent Application No. 2012-172685 filed on Aug. 3, 2012. The entire disclosures of these applications are incorporated by reference herein.

BACKGROUND

Regarding heat dissipation of an electronic component module including chips required to dissipate heat, the following techniques are known, for example.

Japanese Unexamined Patent Publication No. 2003-204013 discloses a structure where via holes are disposed on a board on which a power amplification device required to dissipate heat is mounted so that the heat of the power amplification device is escaped from the via holes. The board also includes a region having a low thermal conductivity to reduce conduction of the heat to a surface acoustic wave device mounted nearby. The power amplification device and the surface acoustic wave device are also separately disposed on the different surfaces of the board to reduce conduction of the heat from the power amplification device to the surface acoustic wave device.

Japanese Unexamined Patent Publication No. 2010-045201 also discloses that only the devices that include flip chips and are required to dissipate heat are covered by solder. This allows heat generated by the devices to be escaped.

SUMMARY

An electronic component module including a board on which a plurality of semiconductor chips and electronic components are mounted (e.g., an electronic component module having a wireless function) might accumulate heat generated by one of the semiconductor chips.

The design is further restricted if, for example, a wireless function is integrated with the board to construct a small, high-performance electronic component module. Specifically, the design is restricted in terms of the heat dissipation because the accumulation of the heat in the electronic component module might cause a noise on the electrical characteristics, or a thermal fatigue caused by the operation for a long time might result in a failure in the electronic component module.

In view of the foregoing, the present disclosure provides an electronic component module including semiconductor chips where heat generated by some of the semiconductor chips is less likely to affect the other semiconductor chips.

The electronic component module of the present disclosure includes a board, a plurality of external terminals, and a first semiconductor chip. The plurality of external terminals are provided on a first surface of the board. The first semiconductor chip is provided on a region on the first surface surrounded by the plurality of external terminals. The first semiconductor chip protrudes more along a normal to the first surface than ends of the external terminals.

Such a configuration allows a back surface (a surface opposite to the multilayer board) of the first semiconductor chip to be in contact with a mounting board on which the electronic component module is mounted, if connecting members such as solder are provided between the external terminals and terminal mounting lands on the mounting board side. Thus, heat generated by the first semiconductor chip can be escaped to the mounting board side.

The electronic component module may include a wiring portion provided on a second surface of the board opposite to the first surface wherein the wiring portion is electrically connected with at least one of the external terminals.

The electronic component module may also include a connecting member provided on an end of each of the plurality of external terminals wherein the connecting member protrudes more along the normal to the first surface than the first semiconductor chip does.

A dimension of protrusion of the first semiconductor chip relative to the external terminal may be smaller than the height of the connecting member to be provided on the mounting board to connect the external terminal with the mounting board.

In this case, the height of the connecting member is small when the electronic component module is mounted on the mounting board, and thus the first semiconductor chip can be in contact with the mounting board.

The wiring portion may also be an antenna wiring having a wireless function. Electronic components may not be provided on the second surface except the antenna wiring. A frame body may be provided on at least a part of a circumference of the first surface of the board. The plurality of external terminals may be buried in the frame body.

In this manner, the electronic component module may be integrated with the antenna wiring.

The electronic component module may further include a second semiconductor chip provided on the region on the first surface surrounded by the plurality of external terminals. The first semiconductor chip may be a baseband IC. The second semiconductor chip may be a radio frequency IC. An area of the first semiconductor chip may be larger than that of the second semiconductor chip. The first semiconductor chip may be thicker than the second semiconductor chip. The amount of heat generation of the first semiconductor chip may be larger than that of the second semiconductor chip.

In this case, heat generated by the baseband IC having a large amount of heat generation is advantageously unlikely to affect the radio frequency IC.

The electronic component module may include a metal layer on the first semiconductor chip wherein, instead of the first semiconductor chip itself, the metal layer more protrudes along the normal to the first surface than the ends of the external terminals do.

In other words, the first semiconductor chip itself does not protrude more than the ends of the external terminals do, and the metal layer provided on the first semiconductor chip more protrudes than the ends of the external terminals do. In this case, if the thickness of the first semiconductor chip itself cannot be modified, the heat of the first semiconductor chip can be escaped to the mounting board side. The metal layer also improves the heat dissipation performance.

The first semiconductor chip and the second semiconductor chip may also be connected with the first surface of the board through bumps.

The electronic component module including the semiconductor chip connected through the bumps is thinner than that including the semiconductor chip connected through a metal fine wire.

Next, an electronic component module assembly of the present disclosure includes a mounting board on which any one of the electronic component modules of the present disclosure is mounted. The external terminals are connected with terminal mounting lands provided on the mounting board through connecting members made of solder. The first semiconductor chip is in contact with a heat dissipation portion of the mounting board.

Such an electronic component module assembly allows heat generated by the first semiconductor chip to be escaped to the mounting board side. Thus, the heat is less likely to affect the second semiconductor chip etc.

The heat dissipation portion may be a metal layer provided on the mounting board.

The heat dissipation portion may also have a structure where a metal is buried in a recessed portion provided on the mounting board.

The heat dissipation portion may be provided on a heat dissipation via passing through the mounting board.

This enables the heat of the first semiconductor chip to dissipate more effectively.

Next, another electronic component module assembly of the present disclosure includes a mounting board on which an electronic component module is mounted. The electronic component module includes a board, a plurality of external terminals provided on a first surface of the board, and a semiconductor chip provided on a region on the first surface surrounded by the plurality of external terminals. On a first surface of the mounting board, provided are terminal mounting lands for electrical connection with the electronic component module, and a heat dissipation portion for dissipating heat of the semiconductor chip mounted on the electronic component module. An amount of protrusion of an end of the heat dissipation portion from the terminal mounting land along a normal to the first surface of the mounting board is larger than that of protrusion of ends of the external terminals from the semiconductor chip along the normal to the first surface of the board.

Such an electronic component module allows heat generated by the semiconductor chip to escape to the mounting board side, thereby reducing the influence of the heat.

Next, the mounting board of the present disclosure is a mounting board on which an electronic component module is mounted. The mounting board includes terminal mounting lands for electrical connection with an electronic component, and a heat dissipation pattern for dissipating the heat of the semiconductor chip mounted on the electronic component module. A metal layer connected with the semiconductor chip of the electronic component module is provided on the heat dissipation pattern.

Such a mounting board allows the semiconductor chip to be in contact with the metal layer when the electronic component module is mounted, and thus the heat of the semiconductor chip can be escaped to the mounting board side. The metal layer also improves the heat dissipation performance.

Next, another electronic component module of the present disclosure includes a board, a plurality of external terminals, a first semiconductor chip, and a second semiconductor chip. The plurality of external terminals are provided on a first surface of the board. The first semiconductor chip and the second semiconductor chip are provided on a region on the first surface surrounded by the external terminals. The amount of heat generation of the first semiconductor chip is larger than that of the second semiconductor chip. A heat generation circuit region of the first semiconductor chip is disposed along one end of the board. At least one of the external terminals is a heat dissipation terminal for escaping heat generated in the heat generation circuit region. The heat dissipation terminal is disposed along one end near the heat generation circuit region in the board.

Such a configuration allows heat generated by the first semiconductor chip to be escaped to one end of the electronic component module, thereby reducing the influence of the heat on the second semiconductor chip.

The heat generation circuit region may be connected with the heat dissipation terminal through a heat dissipation pattern provided on the board.

A heat dissipation member may be provided on the first semiconductor chip. The heat dissipation member may be integrated with the heat dissipation terminal to have a larger area than the areas of the other external terminals.

This allows heat generated by the first semiconductor chip to be escaped to the mounting board side.

Next, another electronic component module of the present disclosure includes a board, a plurality of external terminals, a first semiconductor chip, and a second semiconductor chip. The plurality of external terminals are provided on a first surface of the board. The first semiconductor chip and the second semiconductor chip are provided on a region on the first surface surrounded by the external terminals. The amount of heat generation of the first semiconductor chip is larger than that of the second semiconductor chip. Frame bodies are provided along two opposite sides of the first surface of the board. The external terminals are buried in the frame bodies.

This allows heat generated by the first semiconductor chip to be escaped to one end of the electronic component module, thereby reducing the influence of the heat on the second semiconductor chip.

The first semiconductor chip and the second semiconductor chip may be disposed in line along an extension direction of the frame bodies. Each of the frame bodies may be separated to have a space between the first semiconductor chip and the second semiconductor chip. A plurality of chip components may be provided on the first surface of the board to interrupt the first semiconductor chip and the second semiconductor chip.

Chip components can be used in such a configuration to reduce conduction of heat from the first semiconductor chip to the second semiconductor chip. The heat can also be escaped from the space of the frame body to the outside of the electronic component module.

The electronic component module may include a separation wall separating the first surface of the board into the first semiconductor chip side and the second semiconductor chip side.

This more securely reduces the conduction of heat from the second semiconductor chip to the second semiconductor chip.

The separation wall may also be integrated with the frame bodies.

At least one of the external terminals may be buried in the separation wall.

The separation wall may have the configurations described above.

As described above, heat generated by the semiconductor chip easily dissipates from the electronic component module. Heat generated by some of the semiconductor chips is less likely to affect the other semiconductor chips. This reduces failures, malfunctions, etc. caused by the thermal fatigue of the electronic component module and the assembly including the electronic component module, and contributes to construct a small, thin device.

BRIEF DESCRIPTION OF THE DRAWINGS

FIG. 8A is a schematic top view of an example electronic component module of a second embodiment of the present disclosure. FIG. 8B is a schematic cross-sectional view of the example electronic component module. FIG. 8C is a schematic bottom view of the example electronic component module.

FIGS. 12A-12B illustrate processes of production of the electronic component module in FIGS. 11A-11C.

DETAILED DESCRIPTION

Embodiments of the present disclosure will be described with reference to the drawings.

First Embodiment

Figure 1A:
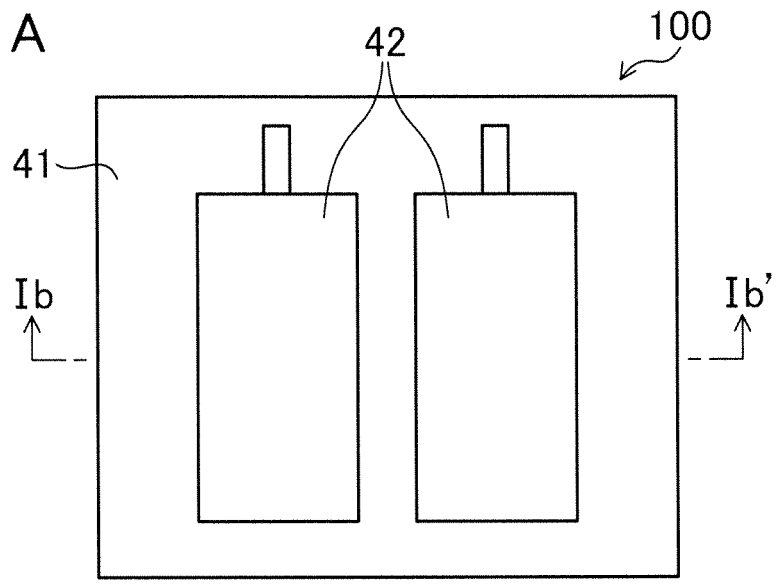
FIG. 1A is a schematic top view of an example electronic component module of a first embodiment of the present disclosure.
Figure 1B:
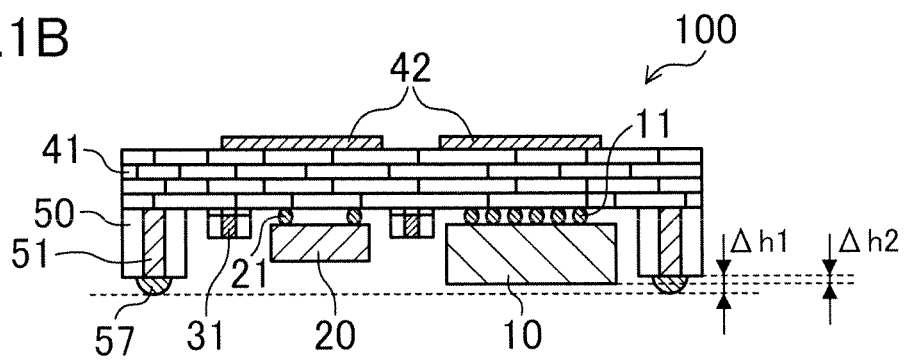
FIG. 1B is a schematic cross-sectional view of the example electronic component module.
Figure 1C:
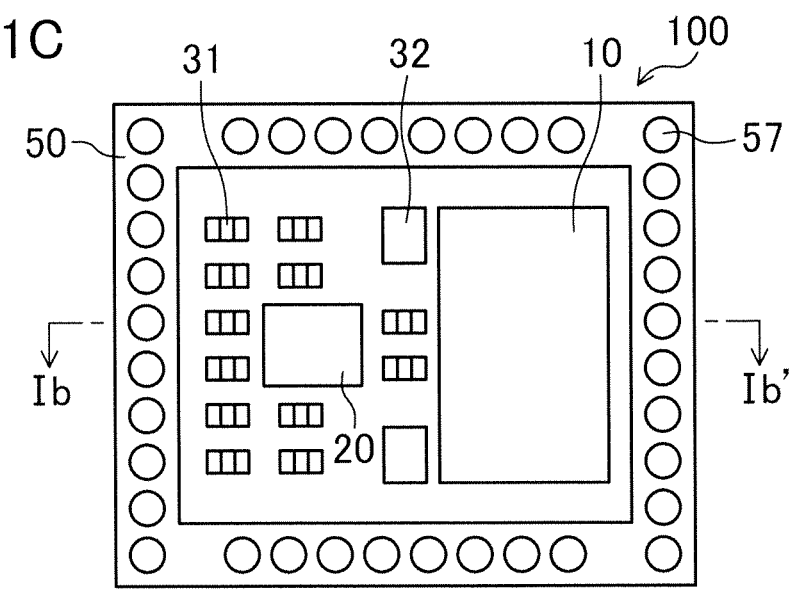
FIG. 1C is a schematic bottom view of the example electronic component module.

FIG. 1A is a schematic top view of an example electronic component module 100 of this embodiment. FIG. 1B is a schematic cross-sectional view of the electronic component module 100. FIG. 1C is a schematic bottom view of the electronic component module 100. FIG. 1B is a cross-sectional view taken along line Ib-Ib' in FIG. 1A, and line Ib-Ib' in FIG. 1C.

The electronic component module 100 includes a multilayer board 41. The multilayer board 41 includes a first surface that is a surface illustrated in FIG. 1C (a lower surface in FIG. 1B), and a second surface that is a surface illustrated in FIG. 1A (an upper surface in FIG. 1B).

Antenna wiring 42 having a wireless function is provided on the second surface of the multilayer board 41. Other semiconductor chips and chip components (resistors, capacitors, etc.) are not provided.

Chip components 31, a first semiconductor chip 10, and a second semiconductor chip 20 are provided on the first surface. The first semiconductor chip 10 is provided on the first surface through bumps 11. The second semiconductor chip 20 is provided on the first surface through bumps 21. The materials of the bumps 11 and the bumps 21 may be selected from Au, Cu, solder, etc. as appropriate. The materials preferably have melting points at which connecting members 57 described later are not deformed during mounting.

A frame body 50 is provided on a circumference of the first surface, and surrounds a region where the first semiconductor chip 10, the second semiconductor chip 20, and the chip components 31 are provided. External terminals 51 are buried in the frame body 50. The external terminals 51 are electrically connected with the antenna wiring 42, the first semiconductor chip 10, the second semiconductor chip 20, etc. The connecting member 57 made of, e.g., solder is provided on an end of the external terminal 51.

Here, as illustrated in FIG. 1B, the first semiconductor chip 10 is thicker than the second semiconductor chip 20. A back surface (a surface opposite to the multilayer board 41) of the first semiconductor chip 10 also protrudes more along a normal to the first surface of the multilayer board 41 (a direction that is perpendicular to the first surface and extends from the first surface to the first semiconductor chip 10 side, or a downward direction in FIG. 1B) than the ends of the frame body 50 and the external terminals 51 do. FIG. 1B illustrates that the back surface of the first semiconductor chip 10 protrudes more by $\Delta h2$ than the ends of the external terminals 51 do.

FIG. 1B illustrates the electronic component module 100 that is not mounted. In this case, the connecting member 57 provided on the end of the external terminal 51 has a thickness $\Delta h1$ where $\Delta h1 > \Delta h2$.

That is, the first semiconductor chip 10 protrudes more along the normal to the first surface than the ends of the external terminals 51 do. The connecting members 57 also protrude more than the first semiconductor chip 10 does.

Figure 2:
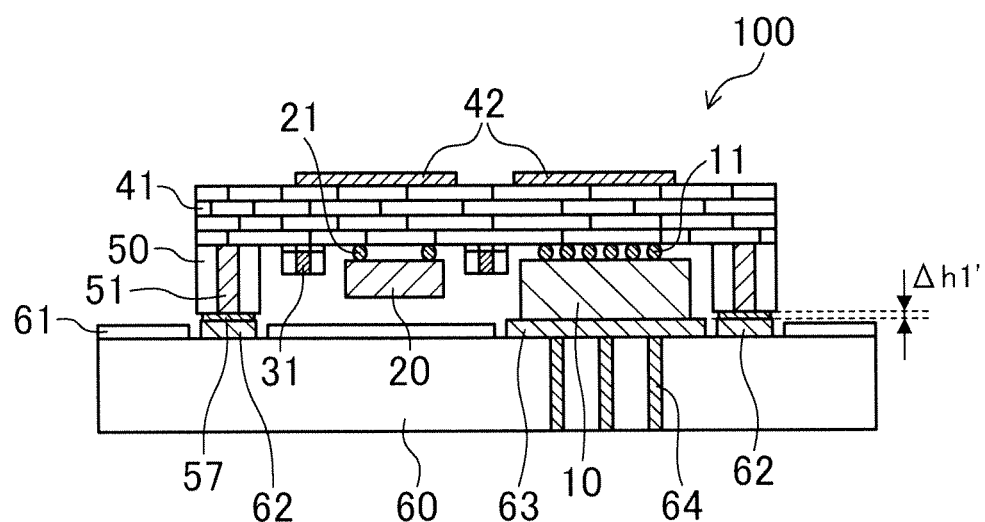
FIG. 2 is a schematic cross sectional view of an assembly including the electronic component module in FIGS. 1A-1C and a mounting board on which the electronic component module is mounted.

Next, FIG. 2 is a schematic cross sectional view of an assembly including the electronic component module 100 and a mounting board 60 on which the electronic component module 100 is mounted.

One of the surfaces of the mounting board 60 is coated with a resist 61. The resist 61 includes a partial opening where terminal mounting lands 62 and a heat dissipation pattern 63 are provided. The terminal mounting lands 62 are for connection to the external terminals 51. The heat dissipation pattern 63 is for connection to the first semiconductor chip 10. The terminal mounting lands 62 and the heat dissipation pattern 63 may be formed from the same metal layer, and may have the same thickness. The heat dissipation pattern 63 is connected with heat dissipation vias 64 that pass through the mounting board 60. The heat dissipation vias 64 are optional, but increase heat dissipation performance.

As illustrated in FIG. 2, between the external terminal 51 and the terminal mounting land 62, a thickness $\Delta h1'$ of the connecting member 57 of the electronic component module 100 mounted on the mounting board 60 is smaller than the thickness Δh1 of the connecting member 57 of the electronic component module 100 not mounted on the mounting board 60. Here, the thickness Δh1' of the connecting member 57 mounted on the mounting board 60 is almost the same as the amount Δh2 of protrusion of the first semiconductor chip 10. Thus, the back surface of the first semiconductor chip 10 is connected with the heat dissipation pattern 63 provided on the mounting board 60. In this case, although not shown, the first semiconductor chip 10 is connected with the heat dissipation pattern 63 through an insulating material.

This allows heat generated by the first semiconductor chip 10 to escape from the mounting board 60 (through the heat dissipation pattern 63, the heat dissipation vias 64, etc.). This avoids accumulation of heat in the electronic component module 100, and reduces malfunctions, failures, etc. caused by the heat of the electronic component module 100.

Figure 3A:
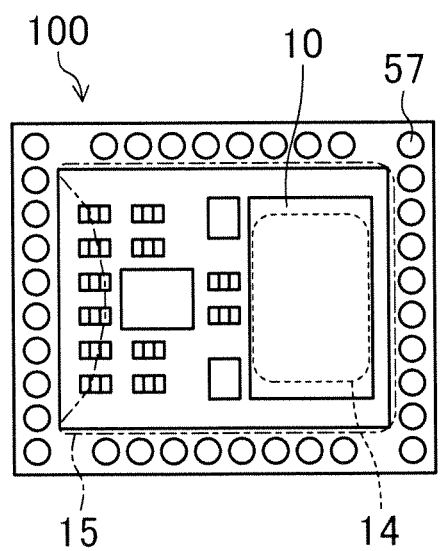
FIGS. 3A and 3B illustrate results of heat simulation of the electronic component modules.
Figure 3B:
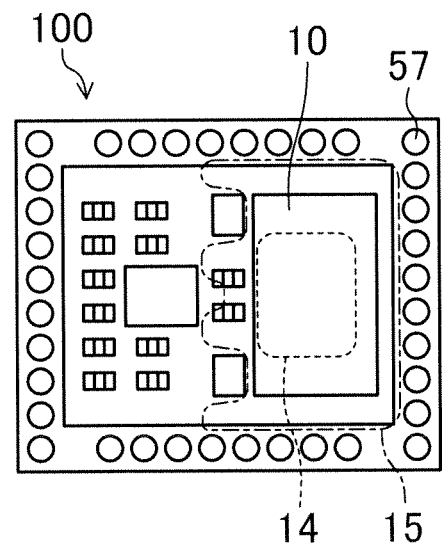

FIGS. 3A and 3B illustrate the results of heat simulation of the electronic component modules. (The figures illustrate the electronic component modules each mounted on the mounting board (not shown) viewed from the mounting surface.)

FIG. 3A illustrates a comparison example where the heat dissipation is not optimized. FIG. 3B illustrates this embodiment (the electronic component module 100) where the heat dissipation is optimized. That is, if the first semiconductor chip 10 has a so proper thickness as to be connected with the heat dissipation pattern 63 provided on the mounting board 60, the state of the heat dissipation is improved from FIG. 3A to FIG. 3B.

A high temperature region 15 appears around a heat generation region 14 in the first semiconductor chip 10. Here, in the comparison example where the heat dissipation is not optimized, the temperature difference between the region where the heat is most generated and the other region is 40° C. in maximum. Such a temperature difference causes thermal fatigue and failures of the components in the electronic component module.

In contrast, in this embodiment, as illustrated in FIG. 3B, both the heat generation region 14 and the high temperature region 15 are decreased. As a result, the thermal fatigue and the failures caused thereby can be reduced.

Here, the heat generation region 14 is a main portion of heat generation of the first semiconductor chip 10, i.e., a region that has a highest temperature after heat is generated by the heat dissipation pattern. The high temperature region 15 is also a region that has a high temperature after the heat is conducted from the heat generation region 14. While the bound of heat generation and the amount of heat generation after the optimization of the heat dissipation are the same as those before the optimization of the heat dissipation, the heat generation region 14 is illustrated in consideration of the influence of the heat dissipation. That is, the heat generation region 14 in FIG. 3B is smaller than that in FIG. 3A because of the optimization.

The temperature difference between the heat generation region 14 and the high temperature region 15 is 20° C.

In this example, the first semiconductor chip 10 is a baseband IC. The second semiconductor chip 20 is a radio frequency IC (RF-IC). The area of the baseband IC is larger than that of the RF-IC. The baseband IC is thicker than the RF-IC. The amount of heat generation of the baseband IC is larger than that of the RF-IC. Thus, the configuration is designed to allow heat generated by the first semiconductor chip 10 to escape toward the mounting board 60.

The antenna wiring 42 is generally separated into two parts: a receiving portion and a transmitting portion. As illustrated in FIG. 1A, this configuration also applies to this embodiment. However, for example, the receiving portion and the transmitting portion each may be separated into two parts, i.e., into four parts in total. The antenna wiring 42 is also electrically connected with the second semiconductor chip 20, which is a radio frequency IC through wiring. It is necessary to design the wiring having a configuration that is unlikely to degrade the transmission/reception performance (in particular, unlikely to increase the loss of the performance). The baseband IC (the first semiconductor chip 10) is an IC that converts (modulates) electric signals transmitted or received by the radio frequency IC.

The electronic component module 100 of this embodiment is required to be thin and small for use of mobile devices such as, in particular, smart phones. For example, the electronic component module 100 preferably has a dimension of approximately 5 mm×5 mm to 15 mm×15 mm in plan view, and a thickness of approximately 0.2 mm to 1.5 mm. This size is for the electronic component module 100 on which the first semiconductor chip 10, the second semiconductor chip 20, and more than ten chip components (resistors, capacitors, etc.) are mounted, and that is also integrated with the antenna wiring 42.

A typical electronic component module is connected with an external antenna. A radio frequency IC is also connected (wire-bonded) with a multilayer board through a metal fine wire. In contrast, the electronic component module 100 of this embodiment is integrated with the antenna wiring 42. The second semiconductor chip 20, which is a radio frequency IC, is mounted on the electronic component module 100 through the bumps. Thus, the antenna performance during high-speed transmission is improved.

The mounting though the bumps more contributes to the miniaturization of the electronic component module 100 than the mounting though the metal fine wire does. Thus, the first semiconductor chip 10 mounted through the bumps contributes to further reduction in the thickness of the electronic component module 100.

As described above, this embodiment provides effective dissipation of heat of the first semiconductor chip 10 having a large amount of heat generation, even if the antenna wiring 42 is provided on one surface (the second surface) of the multilayer board 41 so that the first semiconductor chip 10, the second semiconductor chip 20, etc., which are provided on the opposite surface (the first surface) in this embodiment, cannot be provided on the second surface. Thus, it is unnecessary to embed the first semiconductor chip 10 with resin for the heat dissipation.

First Variation of First Embodiment

Figure 4A:
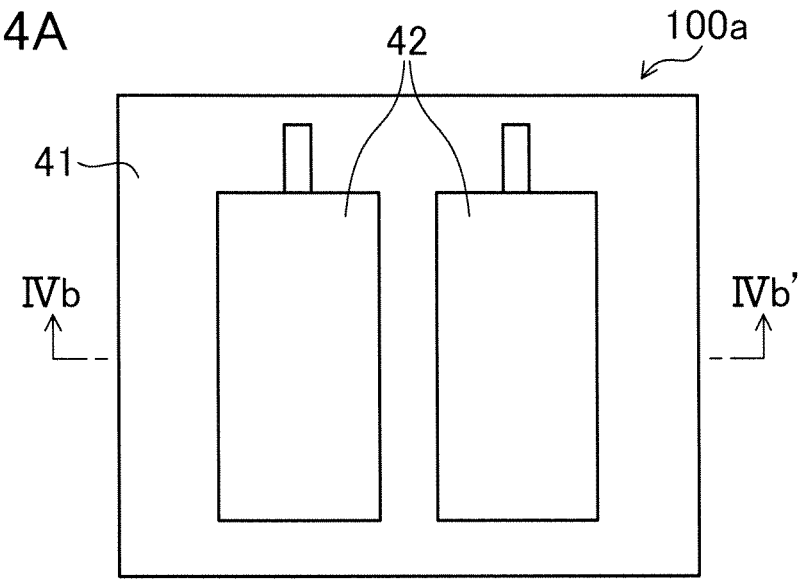
FIG. 4A is a schematic top view of an electronic component module of a first variation of the first embodiment of the present disclosure.
Figure 4B:
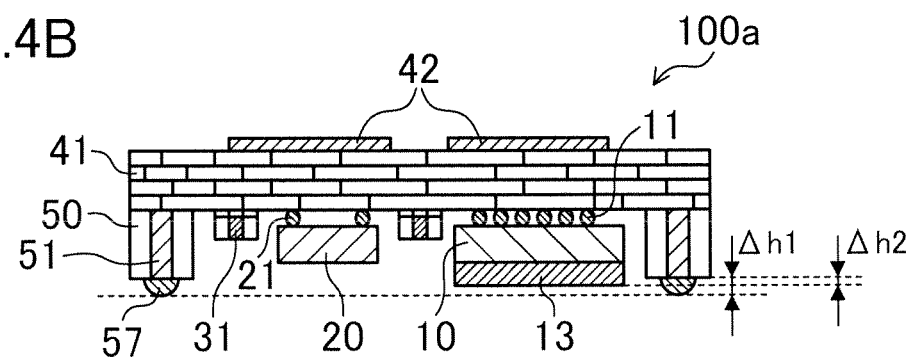
FIG. 4B is a schematic cross-sectional view of the electronic component module.
Figure 4C:
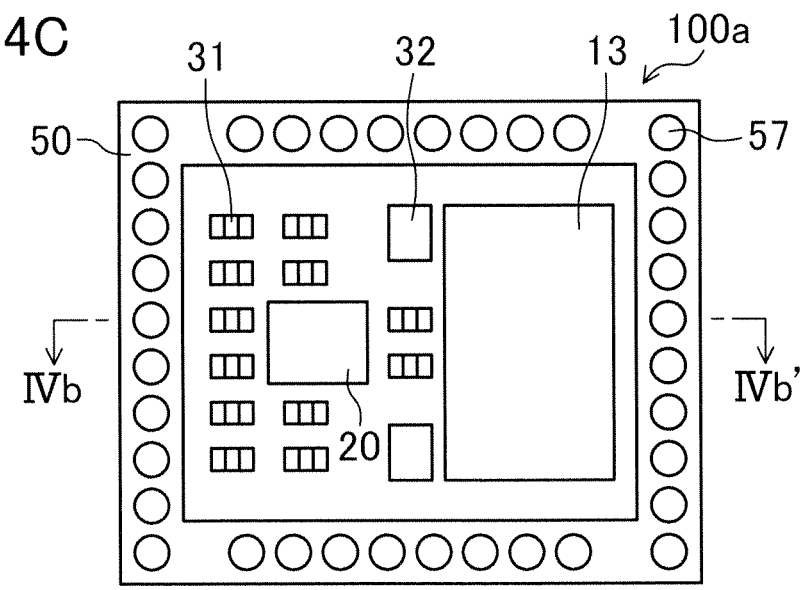
FIG. 4C is a schematic bottom view of the electronic component module.

Next, a first variation of the first embodiment will be described. FIG. 4A is a schematic top view of an electronic component module 100a of this variation. FIG. 4B is a schematic cross-sectional view of the electronic component module 100a. FIG. 4C is a schematic bottom view of the electronic component module 100a. FIG. 4B is a cross-sectional view taken along line IVb-IVb' in FIG. 4A, and line IVb-IVb' in FIG. 4C. Elements in common with those in the electronic component module 100 shown in FIGS. 1A-1C are labeled with the same reference numerals. The differences will be mainly described below.

In this variation, a first semiconductor chip 10 itself is thinner than the first semiconductor chip 10 of the first embodiment in FIG. 1B. The first semiconductor chip 10 of this variation does not protrude along a normal to a first surface of a multilayer board 41 (a downward direction in FIG. 4B) relative to an end of an external terminal 51. A metal layer 13 is stuck on a back surface of the first semiconductor chip 10 through an insulating sheet (not shown). An exposed surface (a surface opposite to the surface stuck on the first semiconductor chip 10, or a lower surface in FIG. 4B) of the metal layer 13 protrudes downward relative to the end of the external terminal 51. The metal layer 13 is, e.g., a metal foil.

Here, the metal layer 13 protrudes more by a dimension $\Delta h2$ than the end of the external terminal 51 does, and similarly to the first embodiment a connecting member 57 has a thickness $\Delta h1$ where $\Delta h1 > \Delta h2$. In other words, the metal layer 13 protrudes more than the end of the external terminal 51 does, and the connecting member 57 protrudes more than the metal layer 13 does.

Figure 5A:
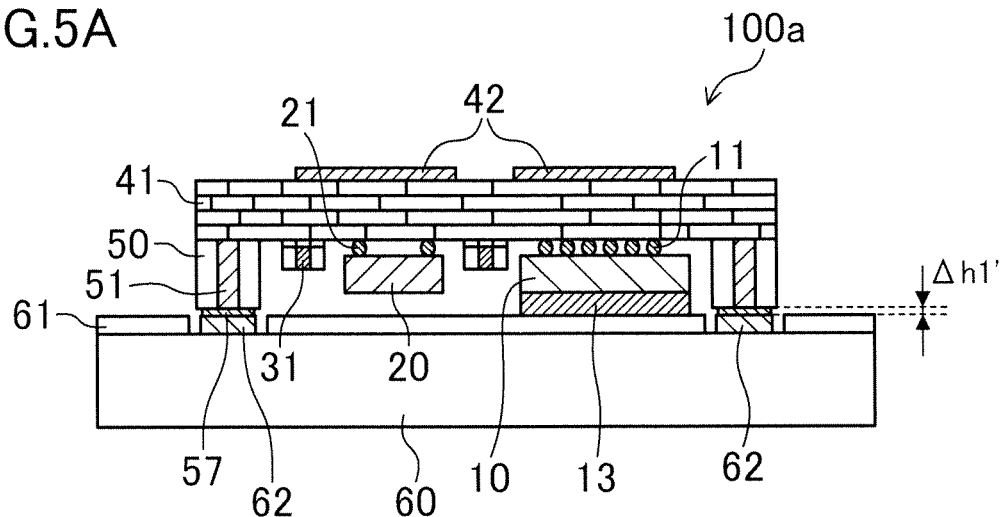
FIG. 5A is a schematic cross sectional view of an assembly including a mounting board on which the electronic component module in FIGS. 4A-4C is mounted.

FIG. 5A is a schematic cross sectional view of an assembly including the electronic component module 100a and a mounting board 60 on which the electronic component module 100a is mounted.

One of the surfaces of the mounting board 60 is coated with a resist 61. The resist 61 includes a partial opening where terminal mounting lands 62 are provided. The terminal mounting lands 62 are for connection to the external terminals 51. In this variation, a heat dissipation pattern is not formed on the mounting board 60.

The exposed surface of the metal layer 13 is in contact with the resist 61 on the mounting board 60 on which the electronic component module 100a is mounted. Here, although not shown, the metal layer 13 is in contact with the resist 61 through an insulating material (e.g., grease etc. having a good heat dissipation performance).

Similarly to the first embodiment, the connecting member 57 has a thickness $\Delta h1'$ after mounting. The thickness $\Delta h1'$ is smaller than the thickness $\Delta h1$ of the connecting member 57 before mounting, and is generally equal to the dimension $\Delta h2$ of protrusion of the metal layer 13 relative to the end of the external terminal 51.

Thus, similarly to the first embodiment, heat generated by the first semiconductor chip 10 is dissipated toward the mounting board 60. Here, the heat dissipation performance of the metal layer 13 is more excellent than that of the first semiconductor chip 10 itself, and thus the metal layer 13 further improves the heat dissipation performance.

If the thickness of the first semiconductor chip 10 cannot be modified (cannot be changed to a thickness so that the first semiconductor chip 10 protrudes more than the end of the external terminal 51 does), the metal layer 13 may also be used to improve the heat dissipation performance of the first semiconductor chip 10.

FIG. 5A illustrates that the metal layer 13 is connected with the resist 61 on the mounting board 60. Alternatively, similarly to FIG. 2B, the mounting board 60 including a heat dissipation pattern 63 provided on an opening of the resist 61 may be used. This further improves the heat dissipation performance. Heat dissipation vias 64 also further improves the heat dissipation performance.

Second Variation of First Embodiment

In the first embodiment and the first variation thereof, the connecting members 57 are provided on the ends of the external terminals 51. Alternatively, the connecting members may be provided on the mounting board 60 side.

Figure 5B:
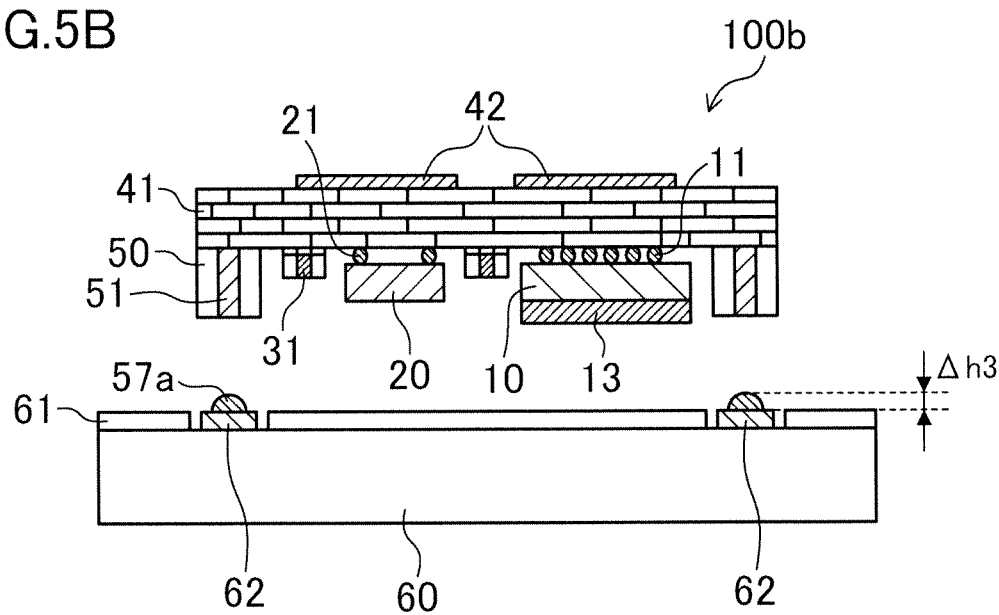
FIG. 5B illustrates an example where connecting members are provided on not the electronic component module but the mounting board.

FIG. 5B illustrates an example where connecting members 57a are provided on terminal mounting lands 62 provided on a mounting board 60. An electronic component module 100b is mounted on such a mounting board 60. The structure of the electronic component module 100b is the same as that of the electronic component module 100a of the first variation except the connecting members 57. The structure after mounting is similar to that in FIG. 5A.

Here, the connecting member 57a has a thickness $\Delta h3$ before mounting, and a thickness $\Delta h3'$ after mounting, where $\Delta h3 > \Delta h3'$ and $\Delta h2 \approx \Delta h3'$.

The connecting members 57a may be provided on the terminal mounting lands 62 provided on the mounting board 60 including a heat dissipation pattern 63, heat dissipation vias 64, etc. The configuration of the connecting members 57a provided on the terminal mounting lands 62 may also be applied to the first embodiment.

Third Variation of First Embodiment

Figure 6A:
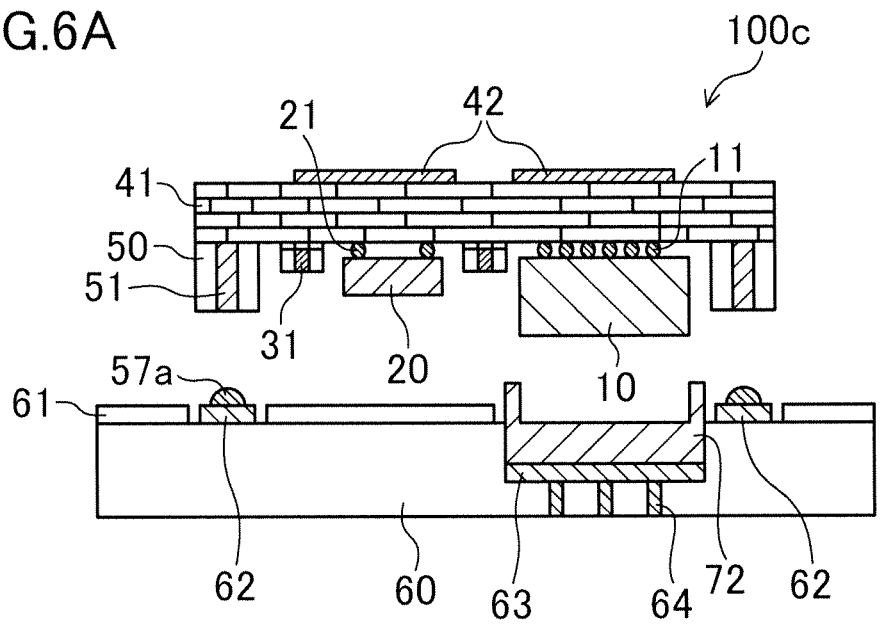
FIGS. 6A and 6B illustrate a heat dissipation structure provided on a mounting board.
Figure 6B:
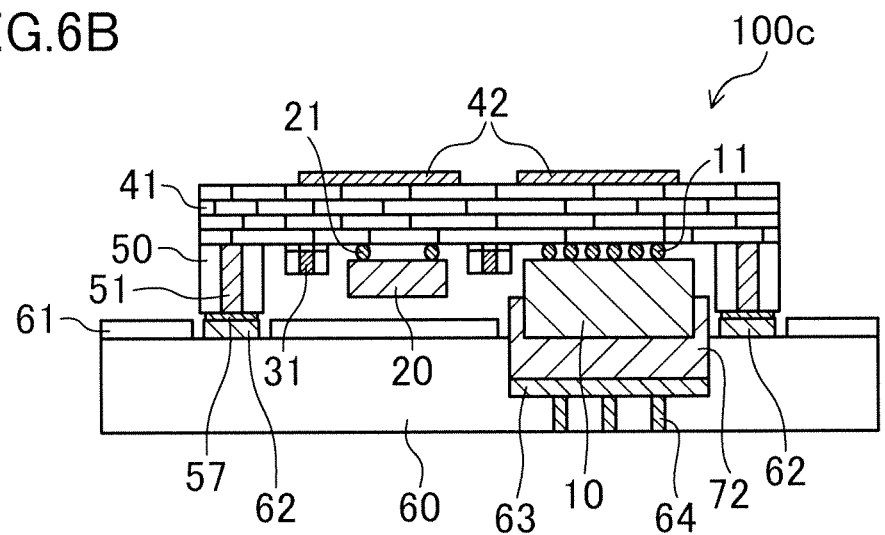

Next, FIGS. 6A and 6B also illustrate a heat dissipation structure provided on a mounting board 60.

In FIG. 2, only the resist 61 has the opening, and the heat dissipation pattern 63 is provided on the mounting board 60. On the other hand, an electronic component module 100c in FIGS. 6A and 6B includes the mounting board 60 including a recessed portion, and a heat dissipation pattern 63 is provided on a bottom portion of the recessed portion. A metal layer 72 is also formed on the heat dissipation pattern 63. The metal layer 72 improves the heat dissipation performance. An intermediate Cu layer in the mounting board 60 may be used to form the heat dissipation pattern 63.

FIGS. 6A and 6B illustrate an example where an electronic component module 100c (that is similar to that in the first embodiment) is mounted. The electronic component module 100c includes a first semiconductor chip 10 and external terminals 51. A back surface of the first semiconductor chip 10 protrudes more than ends of the external terminals 51 do. A level of an upper surface of the metal layer 72 may differ from that of an upper surface of the terminal mounting land 62, depending on the depth of the recessed portion of the mounting board 60, the thickness of the metal layer 72, etc. Thus, the thickness of the first semiconductor chip 10 is designed so that the back surface of the first semiconductor chip 10 is in contact with the metal layer 72 after mounting. Here, an insulating material such as grease etc. may be provided between the first semiconductor chip 10 and the metal layer 72.

The connecting members 57a disposed on the terminal mounting lands 62 have been described as an example. Alternatively, the connecting members 57 may be formed on the electronic component module side.

Fourth Variation of First Embodiment

Figure 7A:
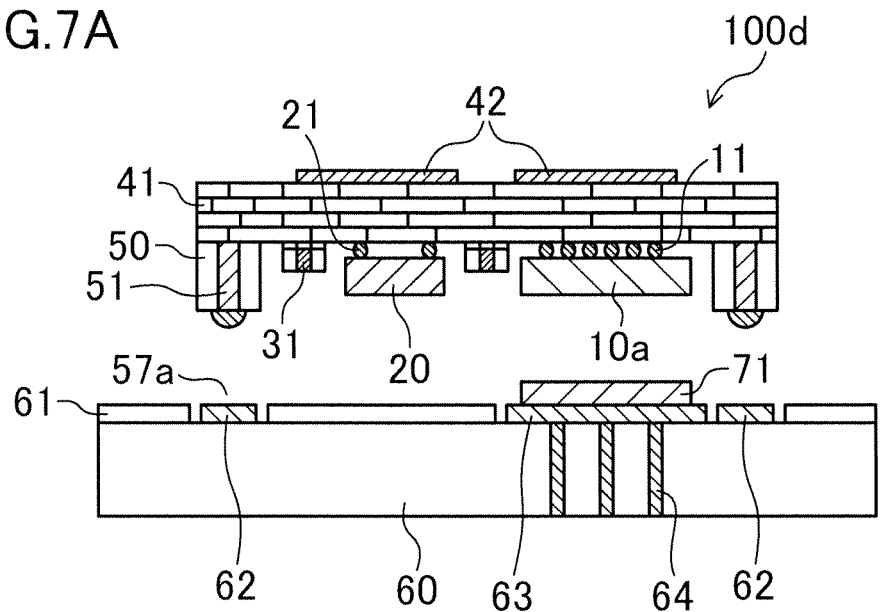
FIGS. 7A and 7B illustrate an example where a heat dissipation pattern is formed on a mounting board without a recessed portion, and a metal layer is provided on the heat dissipation pattern.
Figure 7B:
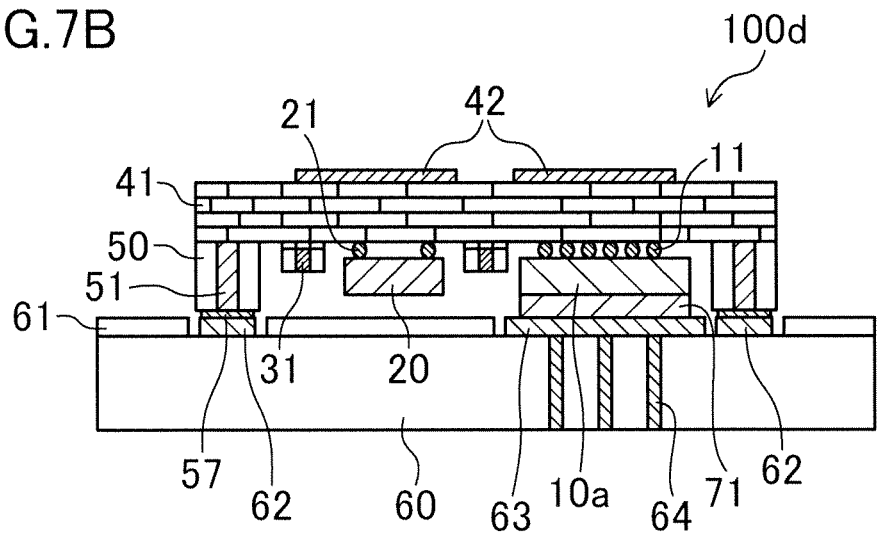

FIGS. 7A and 7B illustrate a variation where a heat dissipation pattern 63 is formed on a mounting board 60 without a recessed portion, and a metal layer 71 is provided on the heat dissipation pattern 63. An insulating material such as grease etc. may be provided between the heat dissipation pattern 63 and the metal layer 71.

An electronic component module 100d of this variation has the structure where the first semiconductor chip 10 does not protrudes more than the ends of the external terminals 51 do (the ends of the external terminals 51 more protrude than the first semiconductor chip 10 does).

The metal layer 71 provided on the heat dissipation pattern 63 on the mounting board 60 allows the first semiconductor chip 10 to be in contact with the metal layer 71 after mounting even if the first semiconductor chip 10 does not protrude (see FIG. 7B). This enables heat to be dissipated from the first semiconductor chip 10 toward the mounting board 60.

The configurations of the electronic component modules described above may be combined with the configurations of the mounting board described above in various manners. The choice between the electronic component module or the mounting board on which the connection component is provided also depends on the situation.

Second Embodiment

Next, an example electronic component module 100e of a second embodiment will be described. FIG. 8A is a schematic top view of the electronic component module 100e of this embodiment. FIG. 8B is a schematic cross-sectional view of the electronic component module 100e. FIG. 8C is a schematic bottom view of the electronic component module 100e. FIG. 8B is a cross-sectional view taken along line VIIIb-VIIIb' in FIG. 8A, and line VIIIb-VIIIb' in FIG. 8C. Elements in common with those in the electronic component module 100 shown in FIGS. 1A-1C are labeled with the same reference numerals.

As illustrated in FIG. 8B, the electronic component module 100e of this embodiment includes a first semiconductor chip 10 having a thickness similar to that of the second semiconductor chip 20. In other words, unlike the first embodiment, the first semiconductor chip 10 does not protrude relative to ends of external terminals 51.

On the first semiconductor chip 10, a heat generation circuit 12 having particularly large heat generation is disposed along one of sides of a multilayer board 41. A heat dissipation pattern 43 that is in contact with the heat generation circuit 12 is formed on a first surface of the multilayer board 41. The heat dissipation pattern 43 is connected with a heat dissipation terminal 52. Here, the heat dissipation terminal 52 is a terminal buried in a frame body 50 similarly to the external terminals 51, and the area of the heat dissipation terminal 52 is preferably larger than that of the external terminal 51. It is also unnecessary for the heat dissipation terminal 52 to provide electrical connection.

In this manner, the heat generation circuit 12 is disposed along the one of the sides of the multilayer board 41, and the heat dissipation pattern 63 and the heat dissipation terminal 52 are provided. This structure enables heat generated by the first semiconductor chip 10 to escape toward the one of the sides of the electronic component module 100e. Thus, the heat of the first semiconductor chip 10 is unlikely to affect the second semiconductor chip 20 etc.

The frame body 50 includes a portion having the heat dissipation terminal 52 (a side from which the heat is dissipated). This portion (this side) is separated from the other sides of the frame body 50 to form spaces. The spaces allow the heat to escape therefrom. The spaces also reduces conduction of the heat to the second semiconductor chip 20 through the frame body 50.

First Variation of Second Embodiment

Figure 9A:
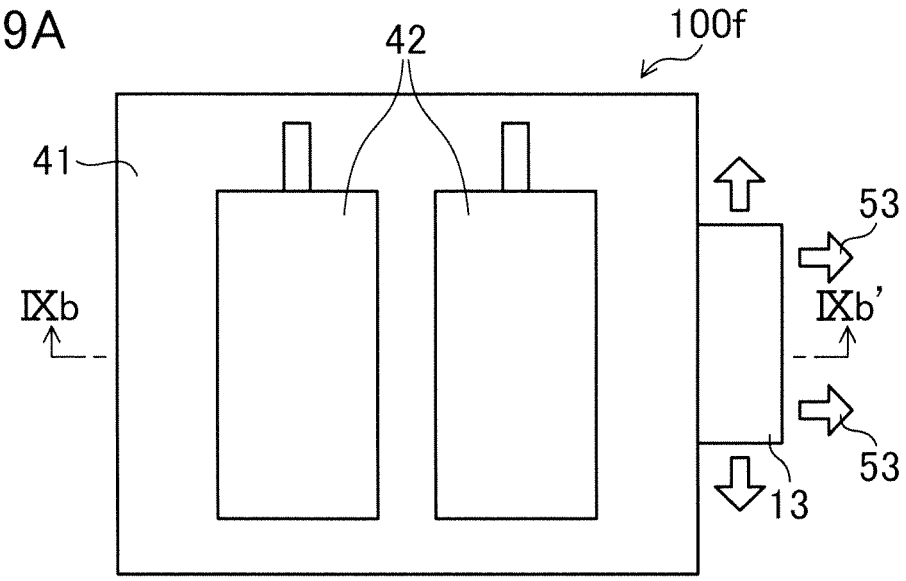
FIG. 9A is a schematic top view of an electronic component module of a first variation of the second embodiment of the present disclosure.
Figure 9B:
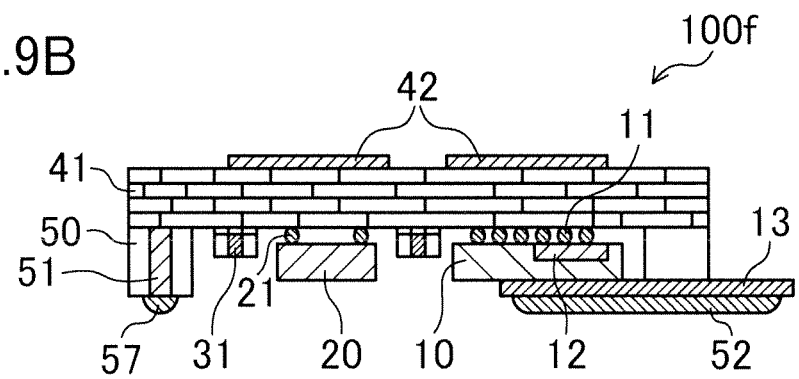
FIG. 9B is a schematic cross-sectional view of the electronic component module.
Figure 9C:
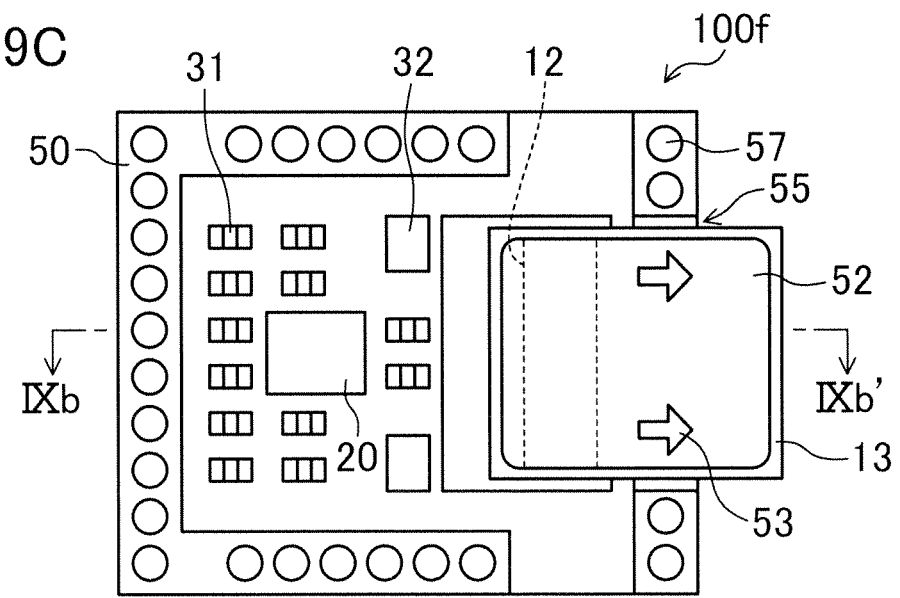
FIG. 9C is a schematic bottom view of the electronic component module.

Next, an example electronic component module 100f of a variation of a second embodiment will be described. FIG. 9A is a schematic top view of the example electronic component module 100f of this variation. FIG. 9B is a schematic cross-sectional view of the electronic component module 100f. FIG. 9C is a schematic bottom view of the electronic component module 100f. FIG. 9B is a cross-sectional view taken along line IXb-IXb' in FIG. 9A, and line IXb-IXb' in FIG. 8C. Elements in common with those in the electronic component module 100e shown in FIGS. 8A-8C are labeled with the same reference numerals.

In this variation, a first semiconductor chip 10 also includes a heat generation circuit 12 that is disposed along one of sides of a multilayer board 41.

In this variation, a heat dissipation pattern is not provided on the multilayer board 41. Instead, a metal layer 13 is provided on a back surface of the first semiconductor chip 10 through an insulating material (not shown). A heat dissipation terminal 52 is further provided on the metal layer 13. The metal layer 13 and the heat dissipation terminal 52 may be accommodated inside the frame body 50. Alternatively, as illustrated in FIGS. 9A-9C, a part of the frame body 50 may be removed so that the metal layer 13 and the heat dissipation terminal 52 protrudes therefrom to the outside of the frame body 50. In this variation, the heat dissipation terminal 52 is not buried in the frame body.

A removal portion 55 that is thinner than the frame body 50 is formed on a place where the part of the frame body 50 is removed, and the metal layer 13 and the heat dissipation terminal 52 are disposed on the removal portion 55. The portion protruding outside the multilayer board 41 may be connected to the mounting board side by soldering etc. If for example the mounting board does not have an enough dimension, the heat dissipation terminal 52 may be designed to be in contact with a metal chassis (a frame) etc. of a set (a device including an electronic component module assembly) so that the heat is escaped to the metal chassis.

A material of the metal layer 13 may be a Cu foil, an aluminum foil, iron, etc. Further, instead of the metal layer, another substance such as a carbon material, which is a high heat dissipation material, may be used Such a configuration also enables heat generated by the first semiconductor chip 10 (in particular, by the heat generation circuit 12) to be dissipated to one of sides of the electronic component module 100f. Thus, the heat of the first semiconductor chip 10 is unlikely to affect the second semiconductor chip 20 etc.

(Method for Producing the Electronic Component Module)

FIGS. 10A-10D are schematic cross-sectional views showing processes of production of the electronic component module 100e of the second embodiment.

Figure 10A:
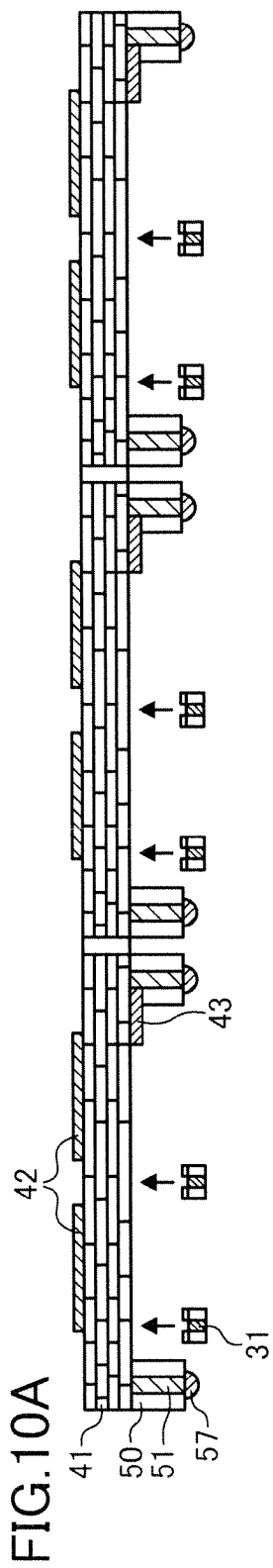
FIGS. 10A-10D illustrate processes of production of the electronic component module in FIGS. 8A-8C.

FIG. 10A illustrates a process for mounting the chip components 31 (resistors, capacitors, etc.) on the multilayer board 41 (a collective board) including a plurality of regions each serving as the electronic component module 100e.

Here, the multilayer board 41 is a board having one surface (the first surface) on which the frame body 50 is integrated. The external terminals 51 in the frame body 50, the connecting members 57 on the external terminals 51, and the heat dissipation pattern 43 are provided on the one surface. The antenna wiring 42 is provided on the other surface.

The chip components 31 are mounted on such a multilayer board 41.

Figure 10B:
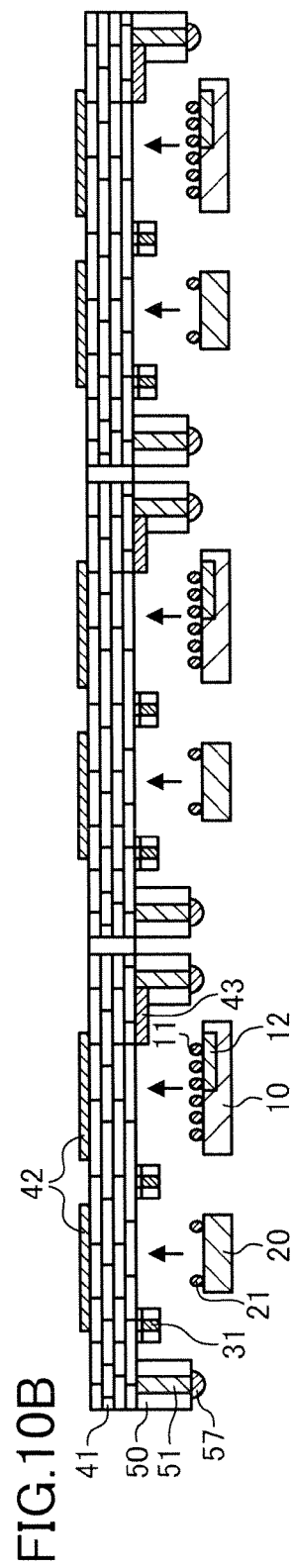

Next, FIG. 10B illustrates a process for connecting the first semiconductor chip 10 and the second semiconductor chip 20 to the above-described region of the multilayer board 41 through the bumps. The first semiconductor chip 10 and the second semiconductor chip 20 are mounted on a portion, of the first surface (the surface opposite to the antenna wiring 42), surrounded by the frame body 50. The heat generation circuit 12 on the first semiconductor chip 10 is also connected with the heat dissipation pattern 43 provided on the multilayer board 41.

Figure 10C:
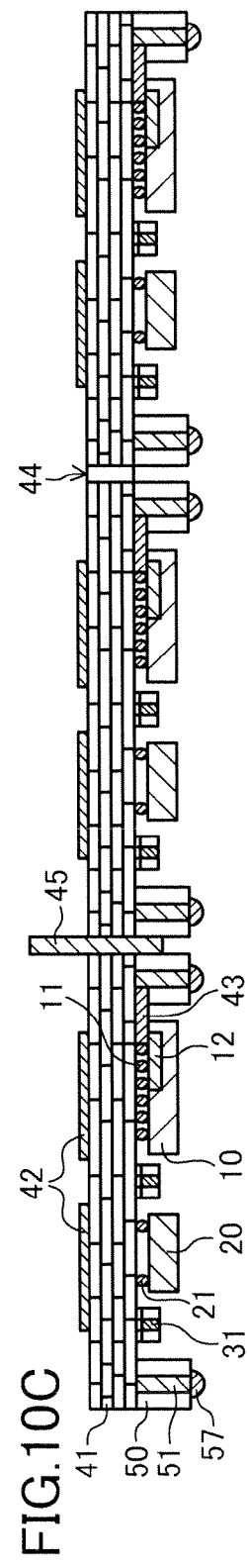

Next, as illustrated in FIG. 10C, the multilayer board 41 (the collective board) is separated at a board separation line 44. The separation is conducted with, e.g., a blade 45.

Figure 10D:
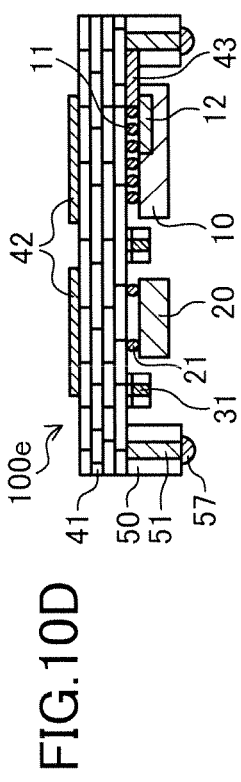

The separation of the multilayer board 41 provides the single electronic component module 100e illustrated in FIG. 10D.

The frame body 50 (the external terminal 51, and the connecting member 57) that are provided on the multilayer board 41 before the chip components 31 are mounted has been described. Alternatively, the frame body 50 may be mounted on the surface concurrently with the installations of the first semiconductor chip 10, the second semiconductor chip 20, and the chip components 31.

Third Embodiment

Figure 11A:
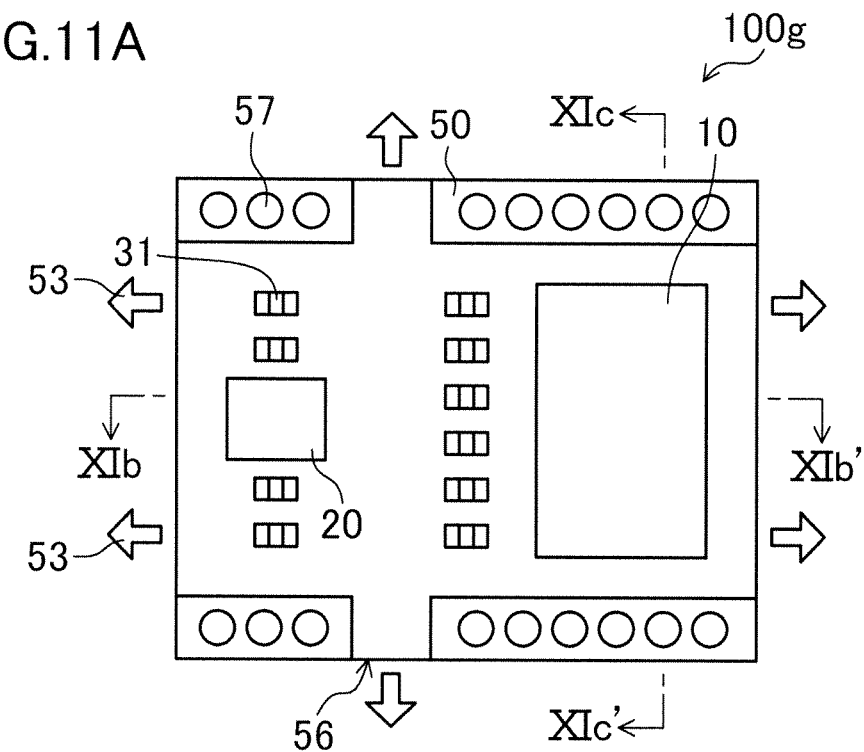
FIG. 11A is a schematic bottom view of an example electronic component module of a third embodiment of the present disclosure.
Figure 11B:
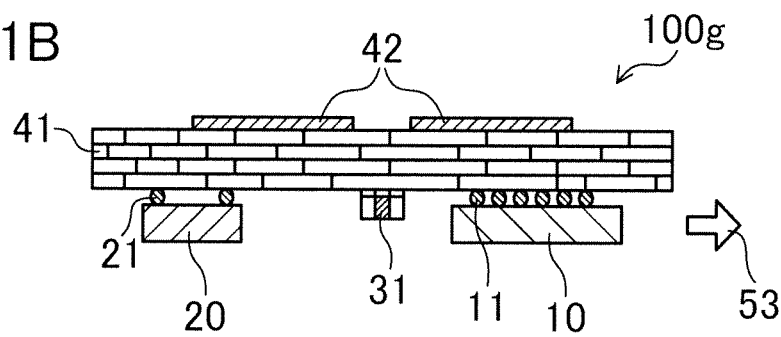
FIGS. 11B and 11C are cross-sectional views of the example electronic component module.
Figure 11C:
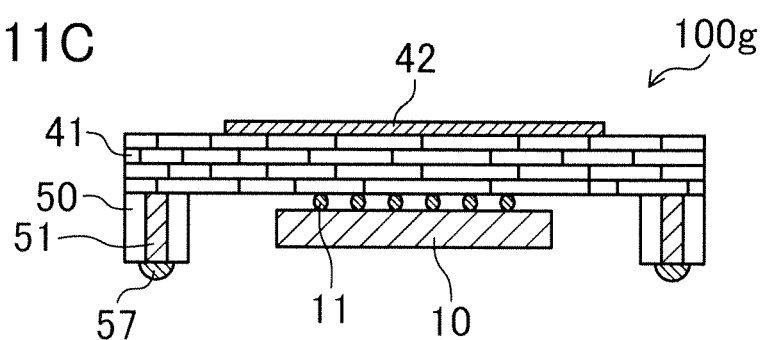

Next, an example electronic component module 100g of a third embodiment will be described. FIG. 11A is a schematic bottom view showing the example electronic component module 100g of this embodiment. FIGS. 11B and 11C are schematic cross sectional views taken along lines XIb-XIb' and XIc-XIc' in FIG. 11A, respectively. Elements in common with those in the electronic component module 100 shown in FIGS. 1A-1C are labeled with the same reference numerals.

The electronic component module 100g of this embodiment includes frame bodies 50 each having external terminals 51. The frame bodies 50 are formed along only two opposite sides of the multilayer board 41. A first semiconductor chip 10 and a second semiconductor chip 20 are also disposed along the frame bodies 50 (a horizontal direction in the example in FIG. 11A). A plurality of chip components 31 are disposed between the first semiconductor chip 10 and the second semiconductor chip 20.

Each of the frame bodies 50 is separated and includes a space 56. The space 56 is positioned between the first semiconductor chip 10 and the second semiconductor chip 20.

Thus, heat generated by the semiconductor chips is escaped mainly from a portion where the frame body 50 is not formed as shown as a heat dissipation route 53. In particular, the chip components 31 are provided between the first semiconductor chip 10 and the second semiconductor chip 20, and thus heat generated by the first semiconductor chip 10 and heat generated by the second semiconductor chip 20 are likely to escape in opposite directions. The heat is also escaped from the space 56 provided on the frame body 50, and the space 56 reduces conduction of the heat from the first semiconductor chip 10 (having a large amount of heat generation) to the second semiconductor chip 20.

Next, FIG. 12A is a bottom view showing a process for producing the electronic component module 100g of this embodiment. FIG. 12B is a cross sectional view taken along line XIIb-XIIb'.

As illustrated in FIGS. 12A and 12B, after the various components are mounted on the multilayer board 41, which is a collective board including a plurality of regions each serving as the electronic component module 100g, the electronic component module 100g is individually separated by a blade 45, laser (not shown), etc. at a board separation line 44.

If the plurality of electronic component modules 100g are connected at the board separation lines 44 in this manner, it is unnecessary to make a spot (the space 56) where the frame body 50 is separated in a state in which the frame body 50 is mounted on the multilayer board 41.

In other words, cutting is required to form the space 56 after the electronic component module is separated. Thus, compared with the cutting, it is easy to separate the electronic component module after the frame bodies 50 each including the space 56 are mounted in a batch on the multilayer board.

The board separation line 44 has an enough width to avoid cutting the board in the separation by a blade, laser, etc. Elements connected with the wiring on the board are not provided on the board separation line 44. The frame body on the board separation line 44 serves to connect the frame bodies 50 that are not separated.

The board separation line 44 allows the frame body 50 including the space 56 to be used as a single component. Thus, it is easy to conduct the operations for the productions.

Even if the configurations of the first semiconductor chip 10, the second semiconductor chip 20, and the chip components 31 are changed, it is easy to change the position, dimension, etc. of the space 56 without change in the production conditions.

If the frame body of the separated electronic component module is, e.g., cut to have the space, it is necessary to reserve a place with which the blade does not come into contact during cutting in order to provide the additional chip components on the place, or it is necessary to change the dimension of the space in order to provide the additional chip components. In contrast, if the board separation line 44 is provided, the frame body 50 can be mounted independently of the layouts of the chip components, the dimension of the space 56, etc. because the space 56 is provided in advance. The semiconductor chip and the electronic components may also be disposed intentionally near the space 56 so that the heat is likely to be dissipated from the space 56.

Fourth Embodiment

Figure 13A:
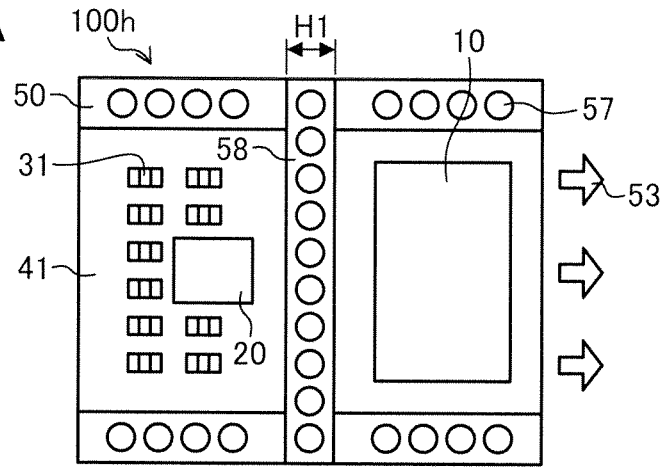
FIGS. 13A-13C illustrate three examples of the electronic component module of the third embodiment of the present disclosure.
Figure 13B:
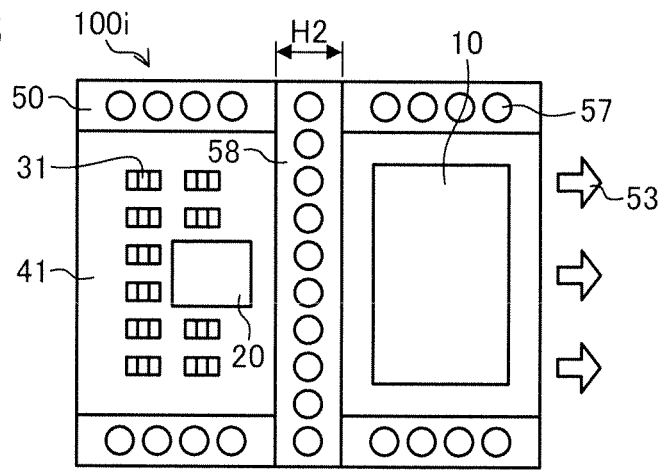
Figure 13C:
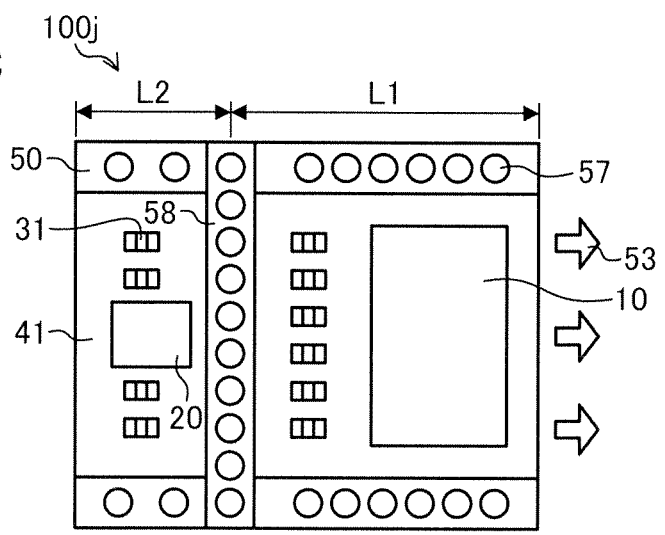

Next, an example electronic component module 100h of a fourth embodiment will be described. FIGS. 13A-13C are schematic bottom views showing three example electronic component modules of this embodiment. Elements in common with those in the electronic component module 100g of the third embodiment in FIG. 8A are labeled with the same reference numerals.

Similarly to the electronic component module 100g of the third embodiment, the electronic component module 100h in FIG. 13A includes frame bodies 50 along two opposite sides of the multilayer board 41.

A separation wall 58 is also formed to separate a first semiconductor chip 10 side from a second semiconductor chip 20 side. The frame bodies 50 and the separation wall 58 form an H shape. The material of the separation wall 58 may be the same as that of the frame bodies 50, or may be a different material having a low thermal conductivity. The separation wall 58 may include external terminals 51.

Such a separation wall 58 can reduce conduction of heat generated by the first semiconductor chip 10 having a large amount of heat generation to the second semiconductor chip 20 side. That is, the heat can be escaped to a side, on the first semiconductor chip 10 side of the multilayer board 41, on which the frame body 50 is not formed (illustrated as a heat dissipation route 53).

Thus, heat generated by the first semiconductor chip 10 is unlikely to affect the second semiconductor chip 20.

In FIG. 13A, the separation wall 58 has a width H1 that is equal to the width of the frame body 50. Alternatively, as illustrated in FIG. 13B, the electronic component module 100i may include the separation wall 58 having a width H2 that is larger than the width of the frame body (i.e., H1<H2). This can securely reduce the heat dissipation to the second semiconductor chip 20 side. The determination of the width of the separation wall 58 depends on a relation between the heat capacity of the electronic component module and the amount of heat generation of the first semiconductor chip 10.

FIG. 13C also illustrates an electronic component module 100j including a separation wall 58 disposed in a modified position. Specifically, FIGS. 13A and 13B illustrate that the separation wall 58 is positioned in the generally middle of the extension direction of the frame body 50. On the other hand, FIG. 13C illustrates the electronic component module where a distance L1 from the middle of the separation wall 58 to an end of the first semiconductor chip 10 side is longer than a distance L2 from the middle of the separation wall 58 to an end of the second semiconductor chip 20 side.

In this manner, it is preferable to provide the separation wall 58 so that the first semiconductor chip 10 side having a large amount of heat generation is larger (where L1>L2). However, it is necessary to provide a certain space for installing the second semiconductor chip 20.

As described above, the heat design of the electronic component module can be optimized by adjusting the position and width of the separation wall 58.

The above-described electronic component module and the assembly thereof, in particular the electronic component module integrated with the antenna wiring can contribute small, high-performance mobile devices. That is, for example, many movies can be downloaded to a smart phone in a short time, or a high-quality video being recorded to a smart phone can be distributed to a plurality of users.

As described above, the electronic component module and the assembly of the present disclosure are integrated with the antenna function and have the improved heat dissipation performance. Thus, the electronic component module and the assembly can be made small and thin, and can be used for mobile devices such as smart phones, tablet computers, mobile phones, laptop computers, etc. that require wireless functions.

What is claimed is:

1. An electronic component module, comprising:
   a board;
   a plurality of external terminals provided on a first surface of the board;
   a first semiconductor chip provided on a region on the first surface surrounded by the plurality of external terminals; and
   a wiring portion provided on a second surface of the board opposite to the first surface,
   wherein
   the wiring portion is electrically connected with at least one of the plurality of external terminals, and
   the first semiconductor chip protrudes more along a normal to the first surface than ends of the external terminals do.

2. The electronic component module of claim 1, further comprising:
   a connecting member provided on an end of each of the plurality of external terminals,
   wherein the connecting member protrudes more along the normal to the first surface than the first semiconductor chip does.

3. The electronic component module of claim 1, wherein a dimension of protrusion of the first semiconductor chip relative to the external terminal is smaller than a height of a connecting member to be provided on a mounting board to connect the external terminal with the mounting board.

4. The electronic component module of claim 1, wherein
   the wiring portion is an antenna wiring having a wireless function,
   electronic components are not provided on the second surface except the antenna wiring,
   a frame body is provided on at least a part of a circumference of the first surface of the board, and
   the plurality of external terminals are buried in the frame body.

5. The electronic component module of claim 1, further comprising:
   a second semiconductor chip provided on the region on the first surface surrounded by the plurality of external terminals, wherein
   the first semiconductor chip is a baseband IC,
   the second semiconductor chip is a radio frequency IC,
   an area of the first semiconductor chip is larger than that of the second semiconductor chip,
   the first semiconductor chip is thicker than the second semiconductor chip, and
   an amount of heat generation of the first semiconductor chip is larger than that of the second semiconductor chip.

6. The electronic component module of claim 1, further comprising:
   a metal layer on the first semiconductor chip, wherein
   instead of the first semiconductor chip itself, the metal layer protrudes more along the normal to the first surface than the ends of the external terminals do.

7. The electronic component module of claim 5, wherein the first semiconductor chip and the second semiconductor chip are connected with the first surface of the board through bumps.

8. An electronic component module assembly, comprising:
   a mounting board on which the electronic component module of claim 1 is mounted, wherein
   the external terminals are connected with a terminal mounting land provided on the mounting board though connecting members made of solder, and
   the first semiconductor chip is in contact with a heat dissipation portion of the mounting board.

9. The electronic component module assembly of claim 8, wherein the heat dissipation portion is a metal layer provided on the mounting board.

10. The electronic component module assembly of claim 8, wherein the heat dissipation portion has a structure where a metal is buried in a recessed portion provided on the mounting board.

11. The electronic component module assembly of claim 8, wherein the heat dissipation portion is provided on a heat dissipation via passing through the mounting board.

12. An electronic component module assembly, comprising:
   a mounting board on which
     an electronic component module including
       a board,
       a plurality of external terminals provided on a first surface of the board, and
       a semiconductor chip provided on a region on the first surface surrounded by the plurality of external terminals is mounted, wherein
   on a first surface of the mounting board, provided are a terminal mounting land for electrical connection with the electronic component module, and a heat dissipation portion for dissipating heat of the semiconductor chip mounted on the electronic component module, and an amount of protrusion of an end of the heat dissipation portion from the terminal mounting land along a normal to the first surface of the mounting board is larger than that of protrusion of ends of the external terminals from the semiconductor chip along a normal to the first surface of the board.

13. An electronic component module, comprising:
a board;
a plurality of external terminals provided on a first surface of the board; and
a first semiconductor chip and a second semiconductor chip provided on a region on the first surface surrounded by the external terminals, wherein
an amount of heat generation of the first semiconductor chip is larger than that of the second semiconductor chip,
a heat generation circuit region of the first semiconductor chip is disposed along one end of the board,
at least one of the external terminals is a heat dissipation terminal for escaping heat generated in the heat generation circuit region, and
the heat dissipation terminal is disposed along one end near the heat generation circuit region in the board.

14. The electronic component module of claim 13, wherein the heat generation circuit region is connected with the heat dissipation terminal thorough a heat dissipation pattern provided on the board.

15. The electronic component module of claim 13, wherein
a heat dissipation member is provided on the first semiconductor chip, and
the heat dissipation member is integrated with the heat dissipation terminal to have a larger area than areas of the other external terminals.

16. An electronic component module, comprising:
a board;
a plurality of external terminals provided on a first surface of the board; and
a first semiconductor chip and a second semiconductor chip provided on a region on the first surface surrounded by the external terminals, wherein
an amount of heat generation of the first semiconductor chip is larger than that of the second semiconductor chip,
frame bodies are provided along two opposite sides of the first surface of the board, and
the external terminals are buried in the frame bodies.

17. The electronic component module of claim 16, wherein
the first semiconductor chip and the second semiconductor chip are disposed in line along an extension direction of the frame bodies,
each of the frame bodies is separated to have a space between the first semiconductor chip and the second semiconductor chip, and
a plurality of chip components are provided on the first surface of the board to interrupt the first semiconductor chip and the second semiconductor chip.

18. The electronic component module of claim 16, comprising:
a separation wall separating the first surface of the board into a first semiconductor chip side and a second semiconductor chip side.

19. The electronic component module of claim 18, wherein the separation wall is integrated with the frame bodies.

20. The electronic component module of claim 18, wherein at least one of the external terminals is buried in the separation wall.

* * * * *